United States Patent
Brodsky et al.

(10) Patent No.: US 7,173,193 B2
(45) Date of Patent: Feb. 6, 2007

(54) METHOD AND STRUCTURE FOR IMPLEMENTING ENHANCED INTERCONNECTION PERFORMANCE OF A LAND GRID ARRAY (LGA) MODULE AND A PRINTED WIRING BOARD

(75) Inventors: William Louis Brodsky, Binghamton, NY (US); Mark Kenneth Hoffmeyer, Rochester, MN (US); James R. Stack, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 309 days.

(21) Appl. No.: 10/403,148

(22) Filed: Mar. 31, 2003

(65) Prior Publication Data

US 2004/0188135 A1 Sep. 30, 2004

(51) Int. Cl.
*H05K 3/02* (2006.01)
*H05K 1/11* (2006.01)
*H01R 12/04* (2006.01)

(52) U.S. Cl. .................. 174/255; 174/261; 361/792; 29/847

(58) Field of Classification Search ............... 174/255, 174/261; 361/792–795; 29/846–853
See application file for complete search history.

(56) References Cited

U.S. PATENT DOCUMENTS

| 5,315,069 A | * | 5/1994 | Gebara | 174/250 |
| 6,366,466 B1 | * | 4/2002 | Leddige et al. | 361/760 |
| 6,380,633 B1 | * | 4/2002 | Tsai | 257/778 |
| 6,597,187 B2 | * | 7/2003 | Eldridge et al. | 324/754 |
| 6,710,258 B2 | * | 3/2004 | Oggioni et al. | 174/255 |

* cited by examiner

*Primary Examiner*—Dean A. Reichard
*Assistant Examiner*—Jeremy Norris
(74) *Attorney, Agent, or Firm*—Joan Pennington

(57) ABSTRACT

A method and structure are provided for implementing enhanced interconnection performance of an electrical connector, such as a land grid array (LGA) module, and a printed wiring board. A multi-layer printed wiring board includes a plurality of predefined ground and power layers. At least one of the predefined ground and power layers includes a thickness variation minimizing structure for minimizing thickness variation. The thickness variation minimizing structure includes a perforated pattern within a selected area of the at least one of the predefined ground and power layers. The selected area is proximate to predefined module sites, such as land grid array (LGA) module sites, in the ground and power layers. The selected area can include regions surrounding each predefined module site, and also can include a region within the module site.

11 Claims, 5 Drawing Sheets

METHOD AND STRUCTURE FOR IMPLEMENTING ENHANCED INTERCONNECTION PERFORMANCE OF A LAND GRID ARRAY (LGA) MODULE AND A PRINTED WIRING BOARD

FIELD OF THE INVENTION

The present invention relates generally to electrical connectors, and more particularly, relates to a method and structure for implementing enhanced interconnection performance of an electrical connector, such as a land grid array (LGA) module and a printed wiring board (PWB).

DESCRIPTION OF THE RELATED ART

Many high performance computer systems and server systems rely on large-scale packaging of multiple high density interconnect modules and printed circuit boards to accommodate efficient interconnection of increasingly complex, high signal speed, integrated circuit devices within a spatial footprint.

Within the general scope of many of these high performance electronic applications, land grid array (LGA) board, module, and connector configurations are commonly used to provide high density, mechanically loaded interconnects in the electronic packaging of a multitude of high performance board and module assemblies used in computer electronics, and a host of military, automotive, aerospace and consumer electronics applications. Within the specific arena of computer electronics development for servers, the continual demands for increasing higher performance, higher speed computing continues to drive proliferation of LGA technology that possesses ever increasing complexity, since use of this technology allows for reliable and efficient interconnection, test and replacement of very costly module configurations while circumventing the inherent reliability and process limitations associated with soldering of large area array packages.

Although LGA assemblies are common in the electronics industry for mounting single chip modules to printed wiring boards, the interconnection of a land grid array (LGA) module to a printed wiring board (PWB) requires the accommodation of a high area density of electronic contacts and must result in a highly reliable electronic connection over a range of operating environments. One method of interconnecting an LGA module to a PWB is by using an interposer or a socket possessing an array of embedded and electrically conductive contact members that are exposed on the front and back faces of the interposer or socket housing. The exposed contacts mirror those of the LGA module and the LGA contact pads on an opposing surface of the PWB. The mounting of the LGA module is then accomplished by aligning the electrical contacts of the LGA module, the interposer and PWB and mechanically compressing the interposer to provide sufficient mating contact and contact force with the respective contact pads of the LGA module and board components.

Use of land grid array interposer or socket assemblies have several advantages over other more traditional methods of component mounting. For example, the modules may be changed or easily upgraded in customer field environments and within manufacturing facilites to facilitate flexible system customization and reduced cost of assembly or rework operations typically required for volume manufacturing production. Further, use of interposer or socket assemblies also reduce effects from thermal expansion mismatch between the chip modules and the PWB by acting as a compliant member between the chip module substrate and the PWB surface. This compliant property of the interposer ensures electrical connectivity of the assembly over a range of thermal and dynamic operating environments.

Recently, the above attributes coupled with a continual demand for higher performance in electronic equipment has led to the development of LGA socket and interposer assemblies for multi-chip module applications. However, the mounting of a multi-chip module (MCM) presents additional challenges due to the greater number of electrical contacts and larger substrate size inherent with this type of electronic component.

A specific key challenge of using LGA sockets with interposers for multi-chip modules is the creation of a consistent mechanical clamping force to compress the interposer between the multi-chip module and the PWB. A consistent clamping force is required to ensure positive electrical connections between the components and to help ensure that the alignment of the assembly over various operating environments is maintained. Also, because multi-chip modules typically possess a high density of electrical contacts on their surfaces, this high density of contacts necessitates an initial accurate alignment of the assembly and a controlled and predictable compression force to maintain the multi-chip module, interposer and PWB in electrical contact.

Various hardware configurations have been employed to achieve the compression of the LGA socket, interposer and multi-chip module assembly. Typical existing systems use one or more spring members to compress the components together. The components are assembled upon the PWB and one or more spring members are deflected by spring actuation hardware thus clamping the components in place. One problem inherent with this approach is the range of spring deflections achieved, and hence the range of clamping forces generated, due to the mechanical tolerances presented by the assembly. The mechanical tolerances of the actuation hardware, multi-chip module, interposer and printed wiring board all directly effect the spring deflections generated in the complete assembly.

More specifically, in order to ensure reliable performance of large LGA connectors, consistent mechanical loading and precise control of mechanical load hardware dimensional tolerances must be applied to all interconnection contacts spanning the LGA site.

As an example, U.S. Pat. No. 6,475,011, issued Nov. 5, 2002 to Sinha et al., entitled Land Grid Array Socket Actuation Hardware For MCM Applications, and assigned to the present assignee, discloses apparatus for applying force to a multi-chip module, a printed wiring board and an interposer to facilitate electrical contact there-between, includes a plurality of load posts, a load transfer plate, a spring member, a backside stiffener plate and a spring actuator. The load posts are affixed to the multi-chip module and pass through the printed wiring board. The load transfer plate has a first stiffness. The spring member is disposed adjacent the load transfer plate and has a second stiffness that is less than the first stiffness. The backside stiffener plate is disposed between the spring member and the printed wiring board and has a third stiffness that is greater than the second stiffness. The spring actuator engages the spring member to apply force to the backside stiffener plate, causing the substrate, the interposer and the printed wiring board to be held in contact.

Unfortunately, in almost all LGA loading configurations, consistent application of contact load is also a function of a variety of additional component tolerances spanning module flatness, specific LGA connector contact compliancy, card surface variations, and card thickness variations within the intended LGA interconnection site. Within this grouping of stacked tolerances, overall printed circuit board thickness variation can be a significant contributor to resultant contact load distribution variability. In fact, load inconsistency resulting from board thickness variation is becoming an increasingly important variable to control, especially on large LGA sites where combined effects from variation in surface topography resulting from plating processes coupled with thickness differences within LGA sites prompted from variation in both via and wiring densities within circuit boards can approach levels on the order of 25–75% of actual LGA connector contact compliances.

To minimize otherwise typically resulting contact load variability within an LGA interconnection system and to provide improved interconnection robustness, U.S. patent application Ser. No. 10/007,986 filed Nov. 13, 2001 to Mark Kenneth Hoffmeyer, entitled Sash for Land Grid Arrays, and assigned to the present assignee, discloses a conductive sash that is etched in a carrier surface around the periphery of LGA sites. The conductive sash is also positioned between modules. Improved interconnection robustness is facilitated by the conductive sash that provides a common interposer seating reference plane and also provides gasket capability and corrosion control.

Further, additional robustness for interconnection installation also is disclosed in U.S. Pat. No. 6,497,582 issued Dec. 24, 2002 to Mark Kenneth Hoffmeyer, entitled LGA Connector With Integrated Gasket, and assigned to the present assignee. Land grid array (LGA) connectors used to attach circuit modules to printed circuit boards present an array of noble metal or semi-noble metal plated contacts to not only effect a reliable connection, but also enable circuit module release and replacement. During replacement, the connector is discarded and a replacement circuit module is used. Only the contact array on the printed circuit board is reused. An in situ gasket carried by the connector is compressed against the circuit board in the assembled condition to form a sealed enclosure about the contact array at the printed circuit board surface which excludes particulate and gaseous contaminants. Thus when the module is replaced, the contact array site on the printed circuit board does not require cleaning or processing to overcome degradation of the contact materials or surfaces. Beyond providing a sealed enclosure, the gasket material should be selected for sealing, but inelastic qualities so that the uniform pressure applied to the contacts of the array is not impaired nor the total required contact force increased.

Finally, although addition of curved stiffener elements or use of loading schemes that bias curvature into loading configurations may also provide improved load control tolerances, applicability and effectiveness are constrained by various hardware restrictions that limit their scope of use. Specifically, these restrictions include available space for incorporation within the system design and their inherent overall effectiveness when used with a combination of various flatness and thickness conditions present on the aggregate module and circuit board combinations being interconnected within a given LGA system design.

As used in the present specification and claims, the term printed wiring board or PWB means a substrate or multiple layers (multi-layer) of substrates used to electrically attach electrical components and should be understood to generally include circuit cards, printed circuit cards, printed wiring cards, and printed circuit boards.

SUMMARY OF THE INVENTION

A principal object of the present invention is to provide a method and structure for implementing enhanced interconnection performance of an electrical connector, such as a land grid array (LGA) module, and a printed wiring board (PWB). Other important objects of the present invention are to provide such method and structure for implementing enhanced interconnection performance of a land grid array (LGA) module and a printed wiring board (PWB) substantially without negative effect and that overcome some of the disadvantages of prior art arrangements.

In brief, a method and structure are provided for implementing enhanced interconnection performance of an electrical connector, such as a land grid array (LGA) module, and a printed wiring board. A multiple layer printed wiring board includes a plurality of predefined ground and power layers. At least one of the predefined ground and power layers includes a thickness variation minimizing structure for minimizing thickness variation. The thickness variation minimizing structure includes a perforated pattern within a selected area of the at least one of the predefined ground and power layers.

In accordance with features of the invention, the selected area is proximate to predefined connection or module sites including, for example, land grid array (LGA) module sites, in the ground and power layers. The selected area can include regions surrounding each predefined module site, and also can include a region within the module site.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiments, structures are provided for implementing enhanced interconnection performance of an electrical connection module, such as a land grid array (LGA) module, and a printed wiring board. In order to minimize contact load variability within an electrical interconnection system, such as an LGA interconnection system, new and unique LGA specific printed wiring board attributes are provided that control aggregate thickness variations within LGA card sites to ensure adequate LGA contact load control and associated reliable interconnect performance. To reduce thickness variations, new wire mesh and anti-pad mesh structures are provided that mitigate thickness variation otherwise resulting from wiring and lamination effects intrinsic to circuit boards.

Figure 1:
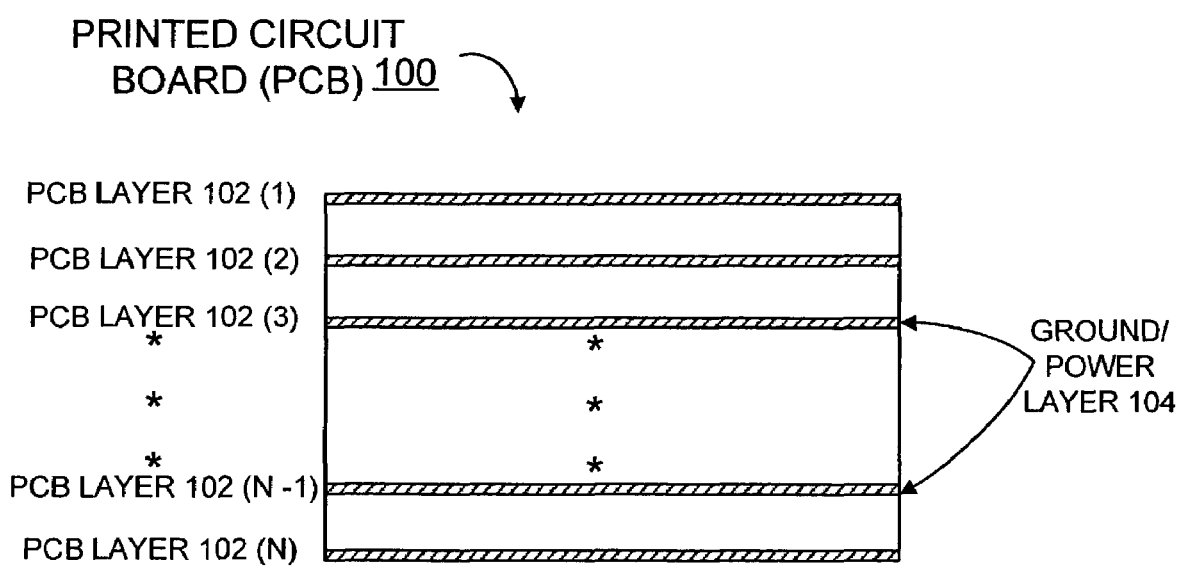
FIG. 1 is a schematic cross sectional side representation illustrating a printed circuit board (PCB) in accordance with the preferred embodiment.

Having reference now to the drawings, in FIG. 1, there is shown a printed circuit or wiring board (PCB or PWB) generally designated by the reference character 100 for implementing enhanced interconnection performance. PCB 100 includes a plurality of PCB layers 102 (1-N), typically including multiple ground and power layers 104.

In accordance with features of the preferred embodiments, a wire mesh structure or an anti-pad mesh structure is provided in an electrically conductive material defining one or more of the power and ground planes 104 of the printed circuit board 100 in predefined areas proximate to a Land Grid Array (LGA) site. The wire mesh structure or the anti-pad mesh structure of the preferred embodiments are disposed in regions surrounding the LGA site or within a region of the LGA module site to provide more uniform thickness to the printed wiring board 100. The wire mesh and anti-pad mesh structures of the preferred embodiments establish an inherently more consistent card cross sectional shape within LGA regions to further enhance consistency in LGA contact load control whether working with, or without additional hardware elements (not shown) that bias LGA contact load configurations.

Typically the local density of anti-pads or clearance pads causes PCB thickness changes within an LGA area. When a PWB is laminated, resin flows into these anti-pads in the LGA area from adjacent regions of PWB material making the laminate material comprising the overall cross section of the PWB 100 within the LGA site thinner than the surrounding board material outside of the LGA site. Based on the viscosity of the resin, rate of cure, and physical dimensions of the flow path, the resin may only be able to flow from a small region surrounding an LGA site. In conventional PCBs, the anti-pads or clearance pads are circular etched openings in signal, ground, and power planes surrounding selected Plated Through Holes (PTHs) locations to prevent the PTH from connecting to the wrong plane. Due to the functional design of a PCB, the ground PTHs are connected to all of the ground planes, the power PTHs are only connected to planes of the same voltage, and signal PTHs typically are connected to only one or two planes. Therefore, a ground PTH typically makes the most amount of plane connections, followed by power PTHs with the signal PTHs having the least number of connections.

Figure 2:
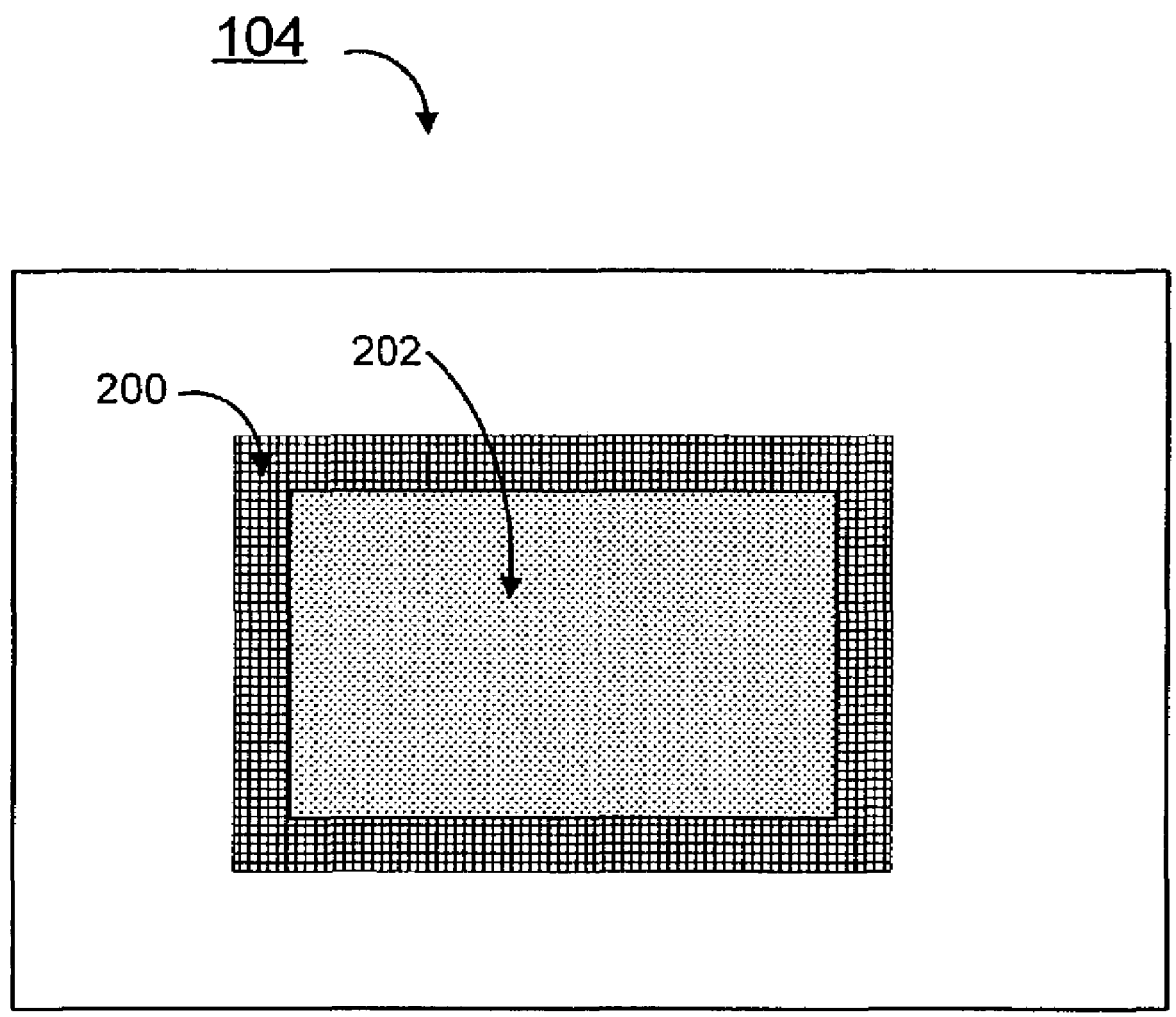
FIG. 2 is a top plan view illustrating a portion of a ground or power plane of the PCB of FIG. 1 in accordance with the preferred embodiment.
Figure 3:
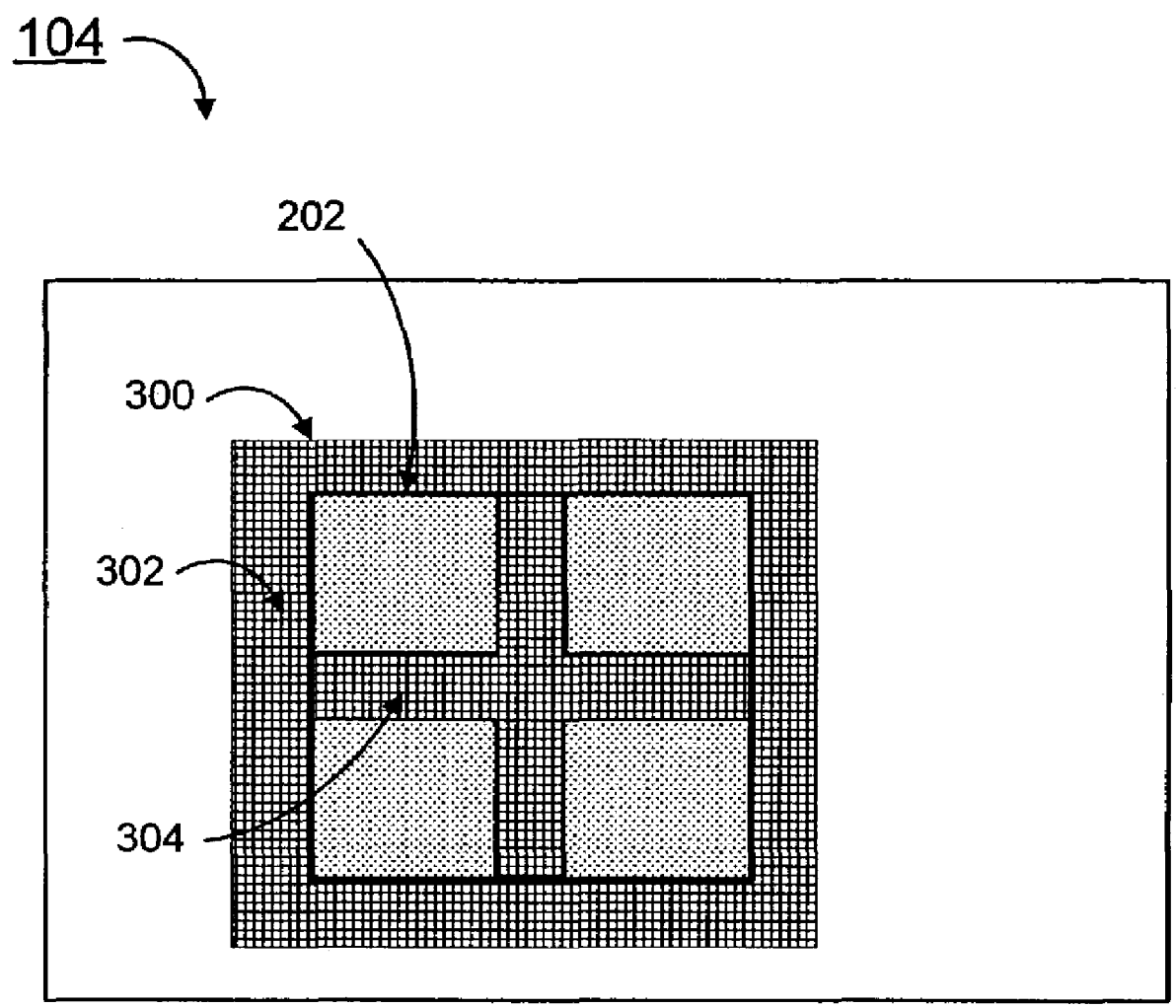
FIG. 3 is a top plan view illustrating a portion of an alternative ground or power plane of the PCB of FIG. 1 in accordance with the preferred embodiment.

In accordance with features of the preferred embodiments, placement of the anti-pad or wire mesh structure, or other alternate special shaped structures, are provided in regions surrounding the LGA module site as shown and described with respect to FIG. 2; or also within the module site as shown and described with respect to FIG. 3. The structure of the preferred embodiments can be provided within the module site, for example, where there is a low density of LGA contacts.

Referring now to FIG. 2, a portion of one or more of the ground and power planes 104 of the PCB 100 is shown with a thickness variation minimizing structure generally designated by the reference character 200 for minimizing thickness variation of the printed wiring board 100 in accordance with the preferred embodiment. The thickness variation minimizing structure 200 surrounds an electrical connection module site 202, such as an LGA module site 202 in selected ground and power planes 104. The thickness variation minimizing structure 200 is defined by the anti-pad or wire mesh structure, such as illustrated in FIGS. 4 and 5.

Referring now to FIG. 3, there is shown an alternative arrangement of one or more of the ground or power planes 104 of the PCB 100. As shown in FIG. 3, a thickness variation minimizing structure generally designated by the reference character 300 for minimizing thickness variation of the printed wiring board 100 in accordance with the preferred embodiment. The thickness variation minimizing structure 300 includes a first or perimeter section 302 surrounding the electrical connection module site 202 and a second section 304 disposed within the electrical connection module site 202 in selected ground and power planes 104. The thickness variation minimizing structure 300 similarly is defined by the anti-pad or wire mesh structure, such as illustrated in FIGS. 4 and 5.

Figure 4:
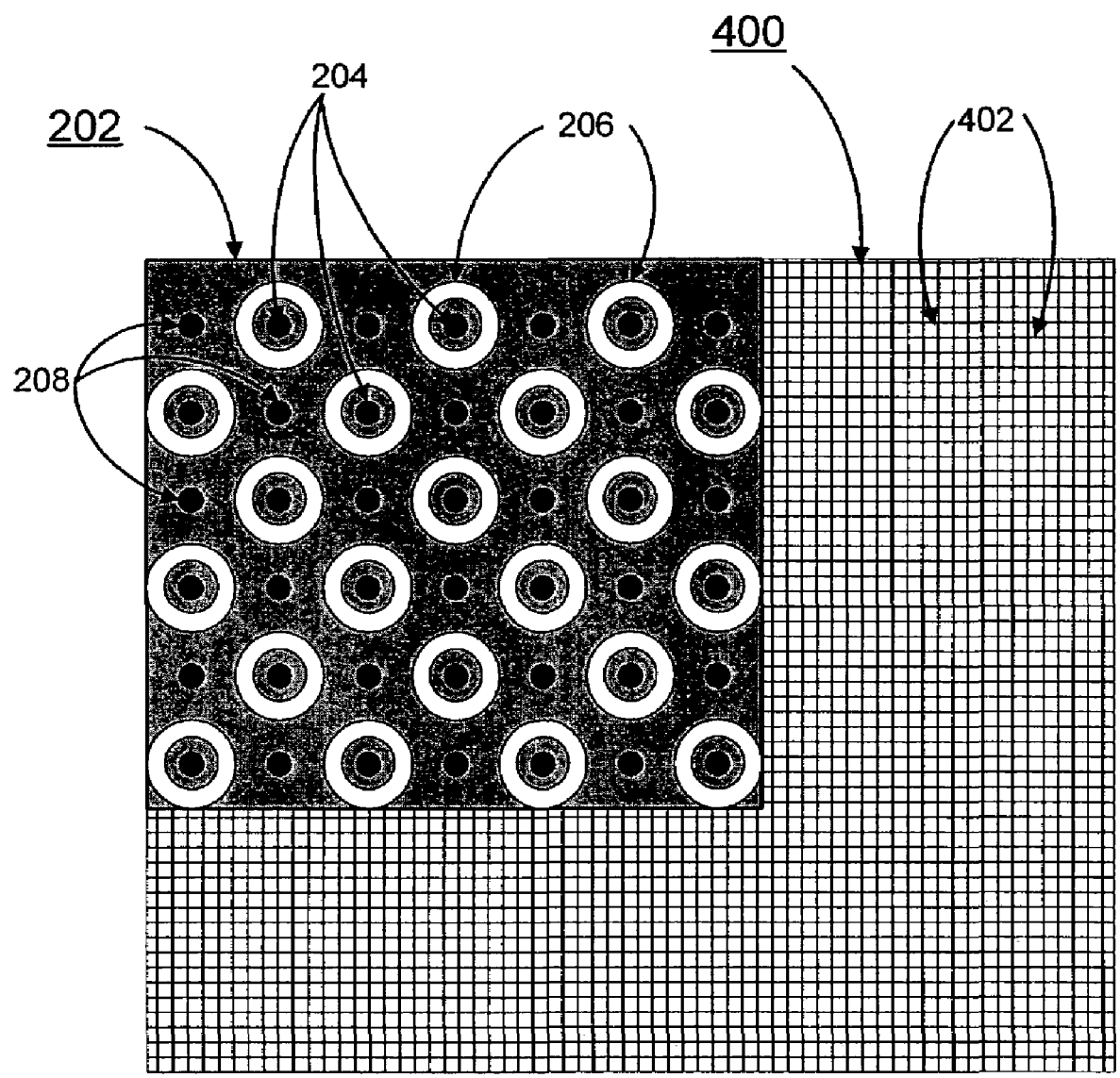
FIG. 4 is an enlarged side fragmentary detailed top plan view illustrating an exemplary embodiment of the ground or power plane of the PCB of FIGS. 2 and 3 in accordance with the preferred embodiment.

Referring now to FIG. 4, there is shown an exemplary embodiment of the ground and power planes 104 of FIGS. 2 and 3 in accordance with the preferred embodiment. The electrical connection module site 202 includes a plurality of Plated Through Holes (PTHs) 204, each surrounded by a respective anti-pad or clearance pad 206 to prevent the PTHs 204 from connecting to the plane 104. The electrical connection module site 202 includes a plurality of Plated Through Holes (PTHs) 208 connecting to the plane 104. PTHs 204 and clearance pads 206 and PTHs 208 are arranged in a grid as conventionally provided within the PCB 100. A wire mesh structure generally designated by the reference character 400 defines a grid or mesh of openings 402. The wire mesh structure 400 implements the thickness variation minimizing structure 200 of FIG. 2 and the thickness variation minimizing structure 300 of FIG. 3. The size and the number of the openings 402 is selectively provided based upon the particular configuration or density of the clearance pads 206 with the module site 202.

Figure 5:
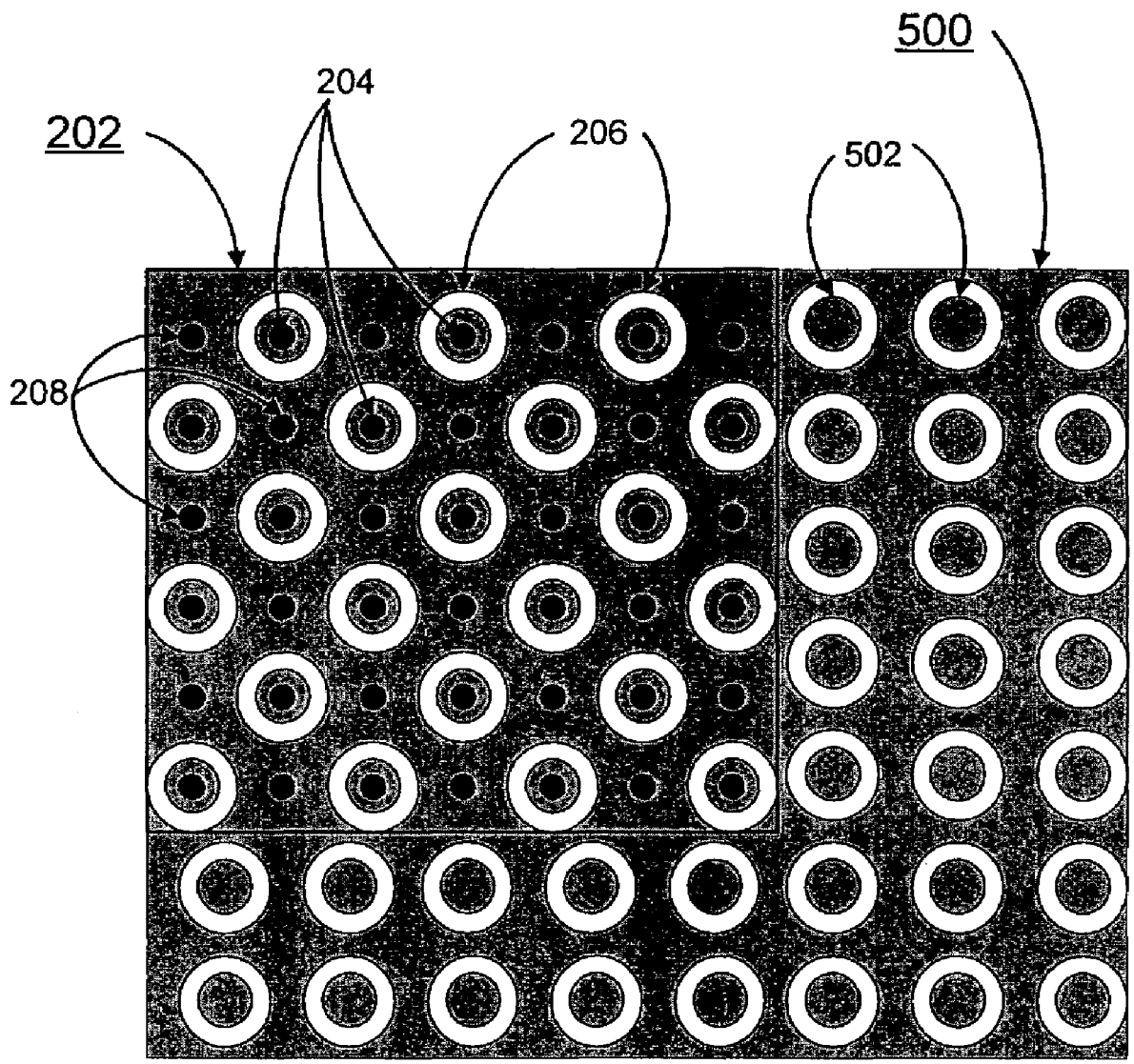
FIG. 5 is an enlarged side fragmentary detailed top plan view illustrating an alternative exemplary embodiment of the ground or power plane of the PCB of FIGS. 2 and 3 in accordance with the preferred embodiment.

Referring now to FIG. 5, there is shown an alternative exemplary embodiment of the ground or power plane of the PCB of FIGS. 2 and 3 in accordance with the preferred embodiment. As shown in FIG. 5, the electrical connection module site 202 similarly includes a plurality of Plated Through Holes (PTHs) 204, each surrounded by a respective anti-pad or clearance pad 206 to prevent the PTHs 204 from connecting to the plane 104. The electrical connection module site 202 includes a plurality of Plated Through Holes (PTHs) 208 connecting to the plane 104. PTHs 204 and clearance pads 206 and PTHs 208 are arranged in a grid as conventionally provided within the PCB 100.

In FIG. 5, an anti-pad mesh structure generally designated by the reference character 500 defines a grid or mesh of openings 502. The anti-pad mesh structure 500 is provided to implement the thickness variation minimizing structure 200 of FIG. 2 and the thickness variation minimizing structure 300 of FIG. 3. The size and the number of the openings 502 is selectively provided based upon the particular configuration or density of the clearance pads 206 with the module site 202.

In accordance with features of the preferred embodiments, providing these anti-pads features 502 or mesh features 402 in the regions 200 of FIG. 2 and 302 of FIG. 3 surrounding the LGA site 202 moves the gradient region or PCB portion that changes thickness outside of the module site 202. Adding the wire mesh structure 400 or the anti-pad mesh structure 500 in regions 304 within areas of module site 202 of low contact density advantageously can bring these module site portions to substantially the same thickness as the surrounding module site.

It should be understood that anti-pad openings 502 may be the standard round design or they may be of other shapes and sizes to aid current flow and provide preferred return current paths. Anti-pad openings 502 may be associated with Plated Through Holes (PTHs) or may be added independently of the PTHs so as not to interface with signal plane wiring and can be arranged so as not to significantly alter signal integrity of underlying and overlying signal wire traces that escape the LGA region.

Thickness control of LGA module sites 202 effectively provided by structures 200 and 300 of the preferred embodiments is particularly important because commercially available LGA connectors provide the ability to accommodate variation in compressed height, for example, of 3 to 5 mils. This tolerance has to accommodate both PWB thickness variation and the module flatness. During actuation of an LGA connector the PWB typically deflects until supported by a backside stiffener. Since the backside stiffeners are typically flat, the backside of the board becomes flat. When the backside of the board is deflected flat all of the thickness variation is present on the front or module side of the PWB. The thickness of the module site is made more uniform by structures 200 and 300 of the preferred embodiments, thereby reducing the tolerances the LGA connector is required to accommodate. Even though thickness of the module site is thinner than the rest of the PWB 100, there is less tolerance for an associated electrical connector to accommodate.

The wire mesh structure 400 and the anti-pad mesh 500 is created and implemented on each selected layer 104 of the PWB 100 by using conventional circuit board processes. Specifically, etching of the predefined patterns in the areas 200 and 300 is provided in selected power and ground planes 104 proximate to LGA contact sites 202.

While the present invention has been described with reference to the details of the embodiments of the invention shown in the drawing, these details are not intended to limit the scope of the invention as claimed in the appended claims.

What is claimed is:

1. A structure for implementing enhanced interconnection performance of an electrical connection module and a printed wiring board comprising:
    a multiple layer printed wiring board including a plurality of predefined ground and power layers;
    at least one of said predefined ground and power layers including a thickness variation minimizing structure for minimizing thickness variation;
    said thickness variation minimizing structure including a perforated pattern within a selected area of said at least one of said ground and power layers; said selected area including a region substantially surrounding a site of the electrical connection module; and the electrical connection module including a land grid array (LGA) module; and
    said perforated pattern within said selected area includes an anti-pad mesh structure.

2. A structure for implementing enhanced interconnection performance as recited in claim 1 wherein said perforated pattern within said selected area includes a wire mesh structure.

3. A structure for implementing enhanced interconnection performance as recited in claim 1 wherein said selected area includes regions disposed within said site of the electrical connection module.

4. A structure for implementing enhanced interconnection performance as recited in claim 1 wherein said perforated pattern within said selected area includes an overall perforation area proportional to a density of clearance pads within said site of the electrical connection module.

5. A structure for implementing enhanced interconnection performance as recited in claim 1 wherein said perforated pattern is implemented using conventional circuit board processing for etching said pattern in said selected area.

6. A method for implementing enhanced interconnection performance of an electrical connection module and a multiple layer printed wiring board including a plurality of predefined ground and power layers, said method comprising the steps of:
    defining a thickness variation minimizing structure in at least one predefined ground or power layer for minimizing thickness variation; said thickness variation minimizing structure including a perforated pattern; and
    providing said perforated pattern within a selected area of said at least one ground or power layer including etching an anti-pad mesh structure to define said perforated pattern within regions inside said module site; said selected area including a region substantially surrounding a site of the electrical connection module; and the electrical connection module including a land grid array (LGA) module.

7. A method for implementing enhanced interconnection performance as recited in claim 6 wherein the step of providing said perforated pattern within said selected area includes providing said perforated pattern within regions inside said module site.

8. A method for implementing enhanced interconnection performance as recited in claim 6 wherein the step of providing said perforated pattern within said selected area includes etching a wire mesh structure to define said perforated pattern within regions inside said module site.

9. A multiple layer printed wiring board for implementing enhanced interconnection performance with an electrical connection module, said printed wiring board comprising:
    a plurality of predefined ground and power layers;
    at least one of said predefined ground and power layers including a thickness variation minimizing structure for minimizing thickness variation;
    said thickness variation minimizing structure including a perforated pattern within a selected area of said at least one of said predefined ground and power layers; said selected area including a region substantially surrounding a site of the electrical connection module; and the electrical connection module including a land grid array (LGA) module; and
    said perforated pattern includes an anti-pad mesh structure.

10. A multiple layer printed wiring board claim 9 wherein said perforated pattern includes a wire mesh structure.

11. A multiple layer printed wiring board as recited in claim 9 wherein said anti-pad mesh structure includes a grid of round perforations.

* * * * *